United States Patent [19]
Zhang

[11] Patent Number: 6,026,011
[45] Date of Patent: Feb. 15, 2000

[54] CMOS LATCH DESIGN WITH SOFT ERROR IMMUNITY

[75] Inventor: Kevin X. Zhang, Portland, Oreg.

[73] Assignee: Intel Corporation, Santa Clara, Calif.

[21] Appl. No.: 09/159,465

[22] Filed: Sep. 23, 1998

[51] Int. Cl.[7] .................................................. G11C 11/00
[52] U.S. Cl. .................... 365/154; 365/189.05; 327/210; 327/211
[58] Field of Search .............................. 365/154, 189.05; 327/199, 200, 201, 202, 203, 208, 210, 211, 212, 214

[56] References Cited

U.S. PATENT DOCUMENTS

| | | | |
|---|---|---|---|
| 5,065,048 | 11/1991 | Asai et al. . | |
| 5,301,146 | 4/1994 | Hama . | |
| 5,365,478 | 11/1994 | Shimohigashi et al. . | |
| 5,465,060 | 11/1995 | Pelella ........................................ | 327/51 |
| 5,473,562 | 12/1995 | Liu ........................................... | 365/154 |
| 5,576,644 | 11/1996 | Pelella ........................................ | 327/51 |
| 5,691,089 | 11/1997 | Smayling . | |
| 5,706,237 | 1/1998 | Ciraula et al. ........................... | 365/222 |
| 5,732,037 | 3/1998 | Shimohigashi et al. . | |
| 5,828,597 | 10/1998 | Madan ..................................... | 365/156 |

*Primary Examiner*—David Nelms
*Assistant Examiner*—Gene N. Auduong
*Attorney, Agent, or Firm*—Blakely, Sokoloff, Taylor & Zafman LLP

[57] ABSTRACT

A CMOS latch circuit comprises a data input node, an output node, and first and second inverters, each of which have an input coupled to the data input node, and an output coupled to the output node. Pairs of feedback NFETs and PFETs are each coupled in series between $V_{CC}$ and ground. Intermediate nodes between each of the NFET and PFET feedback pairs are coupled to the data input node. The gate of the first feedback NFET is coupled to the data input node, and the gate of the second NFET is coupled to the output node. Similarly, the gate of the first PFET is coupled to the output node, and the gate of the second PFET is coupled to the data input node. The CMOS latch circuit maintains a logic state at the output node regardless of a high-energy particle strike.

16 Claims, 3 Drawing Sheets

CMOS LATCH DESIGN WITH SOFT ERROR IMMUNITY

RELATED APPLICATIONS

This application is related to co-pending applications: Ser. No. 09/159,463, filed, Sep. 23, 1998, entitled, "Improved Soft Error Immunity in CMOS Circuits With Large Shared Diffusion Areas"; Ser. No. 09/159,464, filed Sep. 23, 1998, entitled, "A CMOS Register File With Soft Error Immunity"; and Ser. No. 09/159,466, filed Sep. 23, 1998, entitled, "Method for Evaluating Soft Error Immunity of CMOS Circuits"; all of which are assigned to the assignee of the present application.

FIELD OF THE INVENTION

The present invention relates generally to the field of integrated circuits; more particularly, to methods and apparatus for protecting chip circuitry against the harmful effects of radiation.

BACKGROUND OF THE INVENTION

Recently there has been concerted effort among researchers and engineers to protect integrated chip circuitry from the troubling effect of natural background radiation. Natural background radiation, in the form of energetic alpha particles and neutrons, has become an increasingly difficult problem to solve as transistor size shrinks with each new generation of chips. High-energy particle irradiation can corrupt data stored in memory chips, producing what engineers refer to as "soft errors". As the semiconductor industry progresses toward line widths as fine as 0.18 microns, soft errors in data pose a major challenge.

A number of different approaches have been tried to reduce soft error rates in semiconductor devices. By way of example, U.S. Pat. No. 5,691,089 discloses a transistor device for an SRAM in which a doped layer of a radiation sensitive material is formed over a substrate. The radiation sensitive material may be polyamide or a similar organic dielectric. The inventors attribute improved alpha particle immunity to the complete isolation of the SRAM array by the organic dielectric layer.

A semiconductor memory array that reduces the probability of soft errors ascribable to alpha particles is also described in U.S. Pat. Nos. 5,365,478 and 5,732,037. These patents disclose a circuit solution applied to a dynamic randomaccess memory (DRAM). Another example is provided in U.S. Pat. No. 5,065,048, which teaches specialized precharging operations that enlarge the soft error margin against alpha particle strikes in CMOS and BiCMOS logic circuits. Yet another approach to the problem of soft errors in semiconductor memory devices is described in U.S. Pat. No. 5,301,146.

FIG. 1 illustrates a simple memory cell 10 comprising field-effect devices 11–14 arranged as cross-coupled inverters. In its basic operation, memory cell 10 produces a signal at an output node 17 that represents an inverted logic signal of the input applied at node 16. Note that in FIG. 1, capacitor $C_{TOT}$ represents the total node capacitance at node 17 of memory cell 10. In addition, arrow 18 represents a high-energy particle, such as an alpha or neutron particle. If an alpha particle 18 passes the diffusion layer of the drain of an N-type field-effect device (e.g., field-effect device 14) when output node 17 is at a high logic level, electrons generated by the alpha particle strike are collected at the same drain. Thus, the generation of electron-hole pairs by high-energy particles has a tendency to discharge various nodes throughout a logic circuit.

Practitioners in the computer industry are now increasingly concerned about extending soft error rate protection beyond cache memories, especially in the high-end, high performance microprocessor field. For example, latch circuits have traditionally been considered robust with respect to soft errors, and latch circuit soft error rate effects have typically been considered negligible. However, as semiconductor technologies continue to advance beyond 0.25 microns, latch circuits in microprocessors have now become susceptible to soft errors. It is now known that particle strikes can cause latches to fail, leading to data corruption at the system level. Indeed, it is predicted that soft errors in latch circuits will be a significant source of errors in newer generation microprocessors. In the face of this problem, straightforward solutions—such as adding logic protection to all latches—is too costly. Thus, to ensure reliability of future CPU's there is a strong need for a new, improved latch circuit that is robust to soft errors at minimum cost.

SUMMARY OF THE INVENTION

The present invention covers a CMOS latch circuit design that provides immunity to soft errors resulting from alpha particle strikes, or other energetic particles.

In one embodiment, the latch circuit of the present invention comprises a data input node, an output node, and first and second inverters. The first and second inverters each have an input coupled to the data input node, and an output coupled to the output node. First and second n-type field-effect transistors (NFETs) are coupled in series between $V_{CC}$ and ground. An intermediate node between the NFETs is coupled to the data input node. The latch circuit also includes first and second p-type field-effect transistors (PFETs) which are coupled in series between $V_{CC}$ and ground. The first and second PFETs also include an intermediate node that is coupled to the data input node.

The gate of the first NFET is coupled to the data input node, and the gate of the second NFET is coupled to the output node. Similarly, the gate of the first PFET is coupled to the output node, and the gate of the second PFET is coupled to the data input node. This coupling arrangement maintains a logic state at the output node regardless of a high-energy particle strike.

First and second clocking transistors may also be included for transmitting data from the data input node to the intermediate nodes of the NFETs and PFETs, respectively. The first clocking transistor comprises a NFET coupled between the data input node and the intermediate node of the first and second NFETs. The gate of the first clocking transistor is coupled to a first clock signal. The second clocking transistor comprises a PFET coupled between the data input node and the intermediate node of the first and second PFETs, with the gate of the second clocking transistor being coupled to a second clock signal. The second clock signal is the complement of the first clock signal.

BRIEF DESCRIPTION OF THE DRAWINGS

The present invention is illustrated by way of example, and not by way of limitation, in the figures of the accompanying drawings, where.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention. Accordingly, the specification and drawings are to be regarded in an illustrative, rather than a restrictive, sense.

Figure 1:
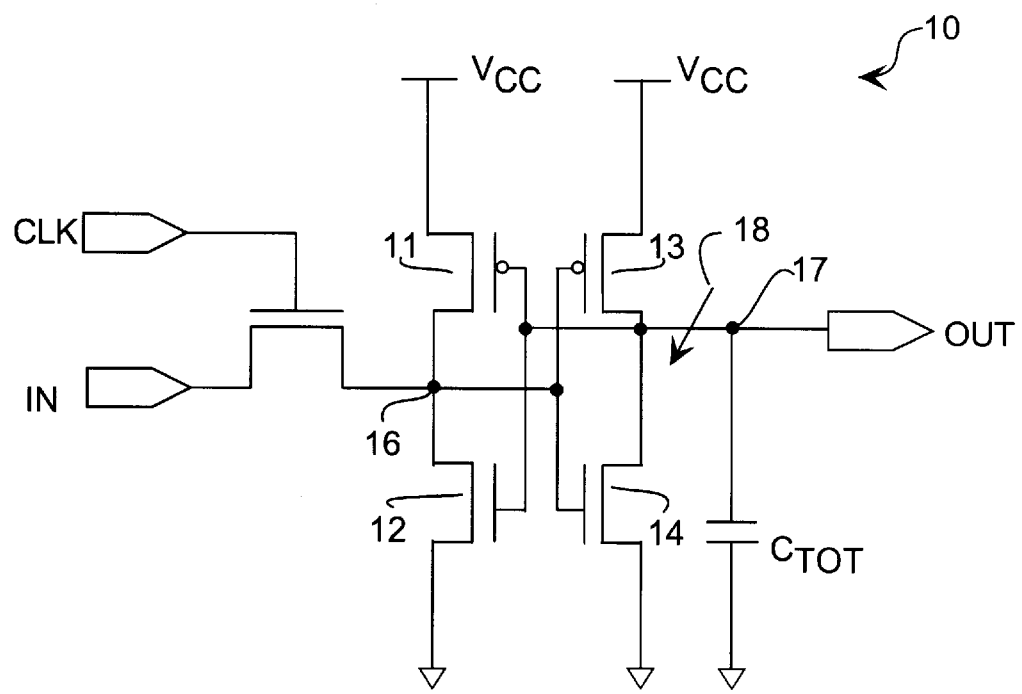
FIG. 1 is a prior art memory cell shown being subjected to a high-energy particle strike.
Figure 2:
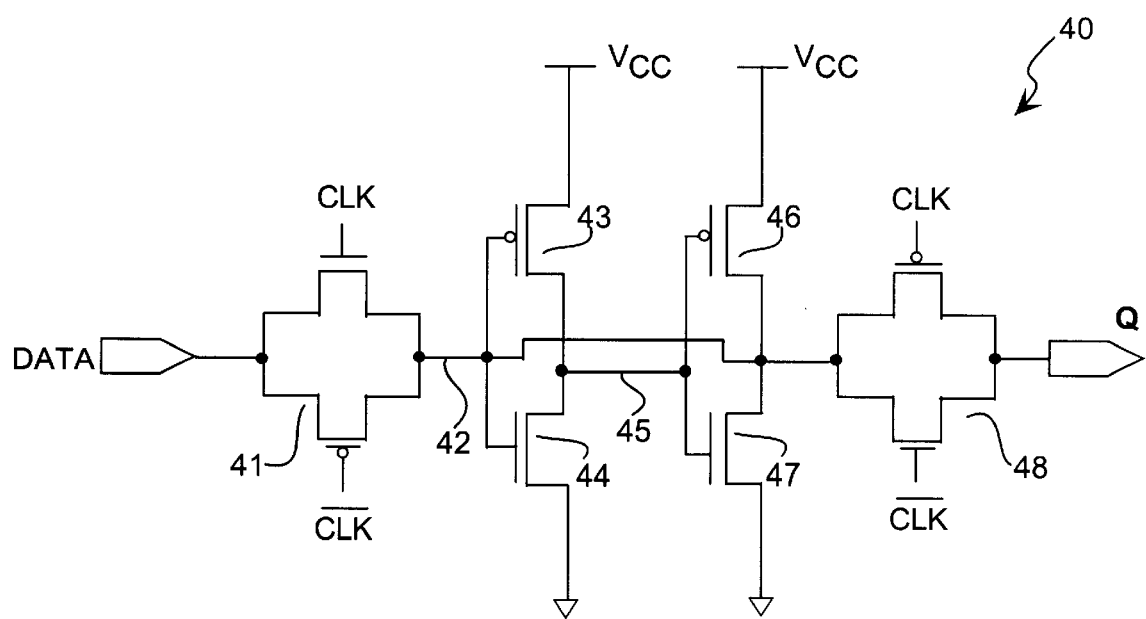
FIG. 2 is a circuit schematic diagram of a conventional CMOS latch circuit.

FIG. 2 illustrates a prior art latch circuit 40 comprising a pair of cross-coupled inverters and data transmission gates 41 and 48. Each transmission gate comprises a n-type field-effect transistor (NFET) coupled in parallel with a p-type field-effect transistor (PFET). As is well understood in the art, when the clock signal, CLK, is high, data is transmitted from the input to the gates of transistors 43 and 44 at node 42. In the example of FIG. 2, node 42 also functions as the output storage for CMOS latch 40.

Each of the inverters shown in FIG. 2 comprises a pair of transistors coupled in series between positive supply potential and ground. For example, one inverter comprises PFET 43 coupled in series with NFET 44, and the second inverter comprises PFET 46 coupled in series with NFET 47. The inverters are cross-coupled by connecting the output of the first pair of transistors 43 and 44 to the gates of transistors 46 and 47 at storage node 15. When the clock signal, CLK, is low, transmission gate 48 provides the latched data at the output node Q.

The drawback associated with CMOS latch 40 of the prior art is that it is susceptible to exposure to high-energy ionized particles. A particle with a high enough energy level which passes through the drain diffusion region of, say NFET 47, can generate sufficient numbers of electron-hole pairs to change the logic state of node 42. Soft errors resulting from high-energy particles have become a major obstacle to the reliability of certain electronic circuits.

Figure 3:
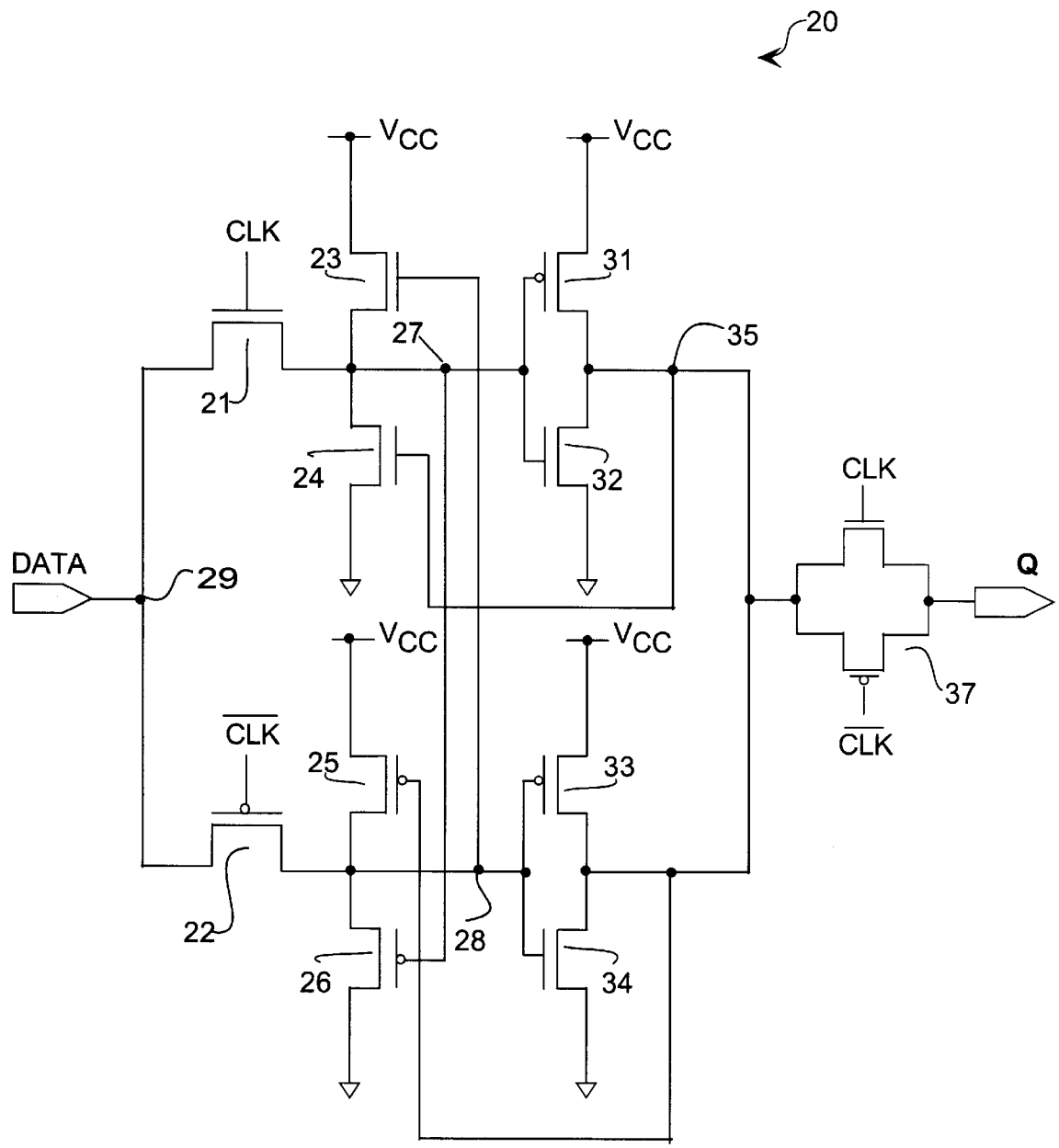
FIG. 3 is a detailed circuit schematic diagram illustrating one embodiment of the present invention.

FIG. 3 illustrates a CMOS latch circuit 20 with soft error immunity. Like latch circuit 40, latch 20 includes a transmission gate 37 that is used to transmit data stored at storage node 35 to output node Q when the clock signal, CLK, is low, but the similarity between the two latches ends there.

Data presented at the input node 29 is transmitted to internal node 27 through NFET transistor 21 when the clocking signal, CLK, transitions high. Similarly, data present at node 29 is transmitted to internal node 28 through PFET transistor 22 when the clock signal, CLK, is high. In other words, the clock signal, CLK, simultaneously transmits data present on node 29 to internal nodes 27 and 28. When the clock signal, CLK, is low, both inverters—comprising transistors 31–34, along with feedback transistors 23–26—operate to maintain the latching logic state at node 35. The inverters may comprise any sort of inverting logic stage, such as an ordinary NAND, NOR, XNOR, etc., gate. Note that the two single pass transistors 21 and 22 may be sized appropriately to overdrive feedback transistor pairs 23, 24 and 25, 26, respectively.

Feedback transistors 23 and 24 are connected in series between positive supply potential Vcc and ground. Both are connected to internal signal node 27, which is also connected to the gate of PFET transistor 26. Likewise, PFET transistors 25 and 26 are coupled between a positive supply potential $V_{CC}$ and ground. Both transistors 25 and 26 are connected to internal node 28, which is also coupled to the gate of transistor 23. The gates of NFET transistor 24 and PFET transistor 25 are both coupled to output node 35.

Internal node 27 is also connected to a first latching inverter comprising PFET 31 and NFET 32. Both transistors 31 and 32 are coupled in series between $V_{CC}$ and ground, with their gates being commonly coupled to node 27. Storage node 35 is the output of the inverter formed by the pair of transistors 31 and 32, which is also the output of the second latching inverter pair of transistors 33 and 34. PFET transistor 33 is shown coupled in series with NFET transistor 34 between $V_{CC}$ and ground, with the gates of both transistors 33 and 34 being commonly coupled to internal node 28.

It should be understood that since internal node 27 is only coupled to n-type diffusion regions (and not p-type diffusions), internal node 27 is only vulnerable to a high energy particle strike when a logic one is stored at this node. In other words, with a logic "1" stored at internal node 27, a high-energy particle strike that passes through the n-type diffusion regions of transistors 21, 23 and 24 will tend to discharge node 27. Similarly, since internal node 28 is coupled to only p-type diffusion regions (and not n-type diffusions) node 28 is only vulnerable when it stores a logic "0".

A crucial aspect of the present invention is that the two internal storage nodes 27 and 28 are cross-coupled, i.e., through transistors 23 and 26. This cross-coupling arrangement causes each node to restore the other if either of the nodes suffers a faulty transition. To understand how this works, consider the example in which a logical "1" is latched on nodes 27 and 28. In this case, only node 27 (the n-type diffusion node) is vulnerable to a soft error resulting from a high-energy particle strike. The reason why is because only n-type diffusion regions storing a logical 1 tend to make a faulty transition from a logical "1" to a logical "0" in response to a strike event.

On the other hand, internal node 28 (the p-type diffusion node) is ordinarily immune from soft errors at a high logic state. Node 28 thus keeps the cross-coupled transistor 23 turned on all of the time to maintain and/or restore node 27 to the voltage level of $V_{CC}-V_{tn}$ (where $V_{tn}$ is the threshold voltage of the NFET). Since the switching point of the inverter formed by transistors 31 and 32 can easily be set below $V_{CC}-V_{tn}$, the output of that inverter (i.e., node 35) is maintained at a logic low state.

On the other hand, if latch 20 has a stored "0" at internal nodes 27 and 28, then only node 28 (the p-type diffusion node) is vulnerable to a soft error. Again, the reason why is because only p-type diffusion regions storing a logical "0" tend to make a faulty transition from a logical "0" to a logical "1" in response to a particle strike. But since node 27 is immune from soft errors at a logical low state, it keeps PFET transistor 27 turned on. This maintains and/or restores node 28 at voltage level of $V_{tp}$ above either ground or $V_{SS}$ (where $V_{tp}$ is the threshold voltage of the PFET). In this situation, the switching point of the inverter formed by transistors 33 and 34 can easily be set above Vtp so that the output of inverter 32 (storage node 35) is kept in a logical high state.

To summarize, CMOS latch 20 maintains its logic state at output node 35 regardless of whether or not a logical "0" or a logical "1" is latched on internal nodes 27 and 28. In addition, the D.C. current is also minimized. This, of course, minimizes static power consumption. Practitioners in the art will further appreciate that besides providing soft error immunity, the simple circuit topology of the present invention keeps area overhead low and power consumption to a minimum. Thus, compared to traditional latch designs, the present invention provides a simple circuit topology that keeps the chip area overhead low, while also minimizing power consumption.

I claim:

1. A latch circuit comprising:
   a data input node;
   an output node;
   first and second inverting logic stages, each having an input coupled to the data input node and an output coupled to the output node;
   first and second NFETs coupled in series between first and second power supply lines, an intermediate node of the NFETs being coupled to the data input node;
   first and second PFETs coupled in series between first and second power supply lines, an intermediate node of the PFETs being coupled to the data input node; and
   wherein the gates of the first and second NFETs are coupled to the data input node and the output node, respectively, and the gates of the first and second PFETs are coupled to the output node and data input node, respectively.

2. The latch circuit of claim 1 wherein the first NFET and the first PFET are each coupled to the first power supply line, and the second NFET and the second PFET are each coupled to the second power supply line.

3. The latch circuit of claim 2 wherein the first and second power supply lines comprise $V_{CC}$ and ground, respectively.

4. The latch circuit of claim 1 further comprising:
   first and second clocking transistors for transmitting data present at the data input node to the intermediate nodes of the NFETs and PFETs, respectively.

5. The latch circuit of claim 4 wherein the first clocking transistor comprises a NFET coupled between the data input node and the intermediate node of the first and second NFETs, the gate of the first clocking transistor being coupled to a first clock signal.

6. The latch circuit of claim 5 wherein the second clocking transistor comprises a PFET coupled between the data input node and the intermediate node of the first and second PFETs, the gate of the second clocking transistor being coupled to a second clock signal, which is a complement of the first clock signal.

7. The latch circuit of claim 6 further comprising:
   a transmission gate which couples the outputs of the first and second inverting logic stages to the output node.

8. The latch circuit of claim 7 wherein the transmission gate comprises a NFET/PFET pair coupled in parallel, the NFET/PFET pair being controlled by the first and second clock signals.

9. The latch circuit of claim 1 wherein the first and second inverting logic stages each comprise a series-connected PFET and NFET, the gates of which are commonly coupled to the data input node.

10. A CMOS latch circuit comprising:
    a data input node;
    an output node;
    first and second NFET/PFET pairs configured as CMOS inverters, each CMOS inverter having an input coupled to the data input node and an output coupled to the output node;
    first and second NFETs coupled in series between first and second power supply lines, an intermediate node of the NFETs being coupled to the data input node;
    first and second PFETs coupled in series between first and second power supply lines, an intermediate node of the PFETs being coupled to the data input node; and
    wherein the gates of the first and second NFETs are coupled to the data input node and the output node, respectively, and the gates of the first and second PFETs are coupled to the output node and data input node, respectively, so as to maintain a logic state at the output node regardless of a high-energy particle strike.

11. The latch circuit of claim 10 wherein the first NFET and the first PFET are each coupled to the first power supply line, and the second NFET and the second PFET are each coupled to the second power supply line.

12. The latch circuit of claim 11 wherein the first and second power supply lines comprise $V_{CC}$ and ground, respectively.

13. The latch circuit of claim 10 further comprising:
    first and second clocking transistors for transmitting data present at the data input node to the intermediate nodes of the NFETs and PFETs, respectively.

14. The latch circuit of claim 13 wherein the first clocking transistor comprises a NFET coupled between the data input node and the intermediate node of the first and second NFETs, the gate of the first clocking transistor being coupled to a first clock signal.

15. The latch circuit of claim 14 wherein the second clocking transistor comprises a PFET coupled between the data input node and the intermediate node of the first and second PFETs, the gate of the second clocking transistor being coupled to a second clock signal, which is a complement of the first clock signal.

16. A CMOS latch circuit comprising:
    a data input node;
    an output node;
    first and second NFET/PFET pairs configured as CMOS inverters, each CMOS inverter having an input coupled to the data input node and an output coupled to the output node;
    first and second NFETs coupled in series between first and second power supply lines, an intermediate node of the NFETs being coupled to the data input node;
    first and second PFETs coupled in series between first and second power supply lines, an intermediate node of the PFETs being coupled to the data input node;
    transmission gate which couples the outputs of the first and second NFET/PFET pairs to the output node; and
    wherein the gates of the first and second NFETs are coupled to the data input node and the output node, respectively, and the gates of the first and second PFETs are coupled to the output node and data input node, respectively, so as to maintain a logic state at the output node regardless of a high-energy particle strike.

* * * * *

UNITED STATES PATENT AND TRADEMARK OFFICE
CERTIFICATE OF CORRECTION

PATENT NO.   : 6,026,011
DATED        : February 15, 2000
INVENTOR(S)  : Zhang

Page 1 of 1

It is certified that error appears in the above-identified patent and that said Letters Patent is hereby corrected as shown below:

<u>Column 6,</u>
Line 53, before "transmission" insert "a".

Signed and Sealed this

Twenty-seventh Day of November, 2001

Attest:

*Nicholas P. Godici*

NICHOLAS P. GODICI
*Attesting Officer*    *Acting Director of the United States Patent and Trademark Office*